United States Patent
Finder et al.

(10) Patent No.: US 6,365,474 B1
(45) Date of Patent: Apr. 2, 2002

(54) METHOD OF FABRICATING AN INTEGRATED CIRCUIT

(75) Inventors: Jeffrey M. Finder, Chandler; Kurt Eisenbeiser, Tempe, both of AZ (US); Bich-Yen Nguyen, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 20 days.

(21) Appl. No.: 09/599,697

(22) Filed: Jun. 22, 2000

(51) Int. Cl.$^7$ .............................................. H01L 21/336
(52) U.S. Cl. ......................... 438/305; 438/197; 438/585
(58) Field of Search .................................. 438/305, 303, 438/301, 299, 197, 585

(56) References Cited

U.S. PATENT DOCUMENTS

| | | | | |
|---|---|---|---|---|
| 3,999,209 A | * | 12/1976 | Wrigley et al. | 39/571 |
| 4,062,037 A | * | 12/1977 | Togei et al. | 257/296 |
| 5,578,421 A | * | 11/1996 | Hasegawa et al. | 430/313 |
| 5,970,331 A | * | 10/1999 | Gardner et al. | 438/199 |
| 6,255,698 B1 | * | 7/2001 | Gardner et al. | 257/369 |

* cited by examiner

*Primary Examiner*—Michael Trinh
(74) *Attorney, Agent, or Firm*—William E. Koch

(57) ABSTRACT

A transistor (12) and method of making an integrated circuit (10) uses a chromium based sacrificial gate (22A) to align, dope and activate source and drain portions (36, 38, 52, 53,) of the transistor. The transistor is subjected to a high temperature to activate the source and drain, which would damage a high permittivity gate dielectric. The sacrificial gate is removed by etching with ceric ammonia nitrate. A high permittivity gate dielectric (72) and a final gate electrode (74) are formed over a channel (30) of the transistor. Electrodes (76, 78) are formed for coupling to the source and drain.

23 Claims, 3 Drawing Sheets

METHOD OF FABRICATING AN INTEGRATED CIRCUIT

FIELD OF THE INVENTION

The present invention relates in general to semiconductor devices, and more particularly to transistors fabricated on high density integrated circuits.

BACKGROUND OF THE INVENTION

There is a continuing demand for higher density integrated circuits with smaller transistor dimensions. For example, the dimensions of future transistors are expected to be scaled down to one hundred nanometers or less, and to be fabricated with gate dielectrics made with high permittivity materials.

However, integrated circuits are subjected to temperatures exceeding one thousand degrees Celsius in order to activate the transistor's source and drain diffusions. Most if not all high permittivity materials are unable to withstand such high temperatures without degradation. This problem can be avoided by using a sacrificial or dummy gate to align a transistor's source and drain. The dummy gate typically is formed with polysilicon or silicon dioxide, which can withstand the high temperature activation. After activating the source and drain, the dummy gate is removed and the high permittivity material is deposited to form the gate dielectric.

A dummy gate process has a disadvantage that removing the dummy gate causes extraneous material to be removed as well, which reduces the control over critical transistor dimensions. Moreover, voids often are left, which increases stress in the transistor and degrades the reliability of the integrated circuit.

Hence, there is a need for a structure and method of fabricating a transistor which maintains good control over critical transistor dimensions and which does not leave voids which degrade reliability.

BRIEF DESCRIPTION OF THE DRAWINGS

The specific objects and advantages of the present instant invention will become readily apparent to those skilled in the art from the following detailed description thereof taken in conjunction with the drawings in which.

DETAILED DESCRIPTION OF THE DRAWINGS

In the figures, elements having the same reference numbers have similar functionality.

Figure 1:
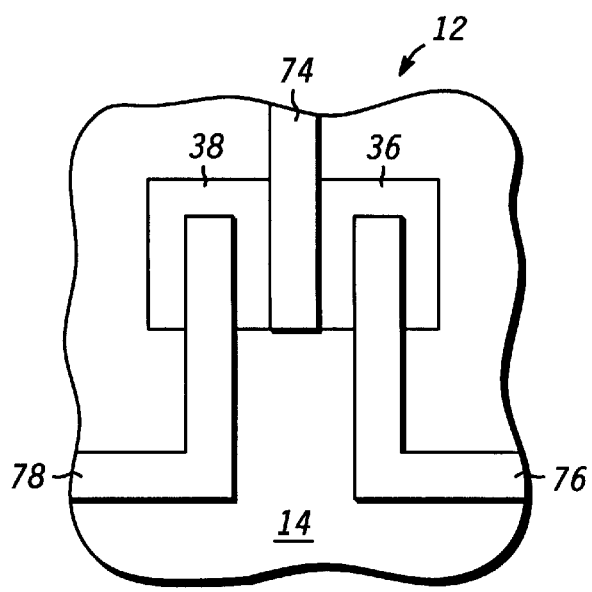
FIG. 1 shows a top view of an integrated circuit including a transistor.

FIG. 1 shows a top view of an integrated circuit 10 formed on a semiconductor substrate 14. A transistor 12 has a source 36 and a drain 38 coupled to electrodes 76 and 78, respectively. An electrode 74 operates as a gate of transistor 12, altering the conductivity of substrate 14 to control current between source 36 and drain 38. Electrodes 74, 76 and 78 are used for coupling electrical signals to other internal or external electrical components (not shown). The distance from source 36 to drain 38 typically is one hundred nanometers or less. In one embodiment, transistor 12 operates as an N-channel metal-oxide-semiconductor field effect transistor.

Substrate 14 comprises a semiconductor material. In one embodiment, substrate 14 is formed from silicon doped to a p-type conductivity. Substrate 14 alternatively may comprise germanium, gallium arsenide or other semiconductor material. As a further alternative, substrate 14 may be doped to an n-type conductivity.

The fabrication of integrated circuit 10 using a sacrificial, i.e., replacement or dummy, gate process is described in detail as follows.

Figure 2:
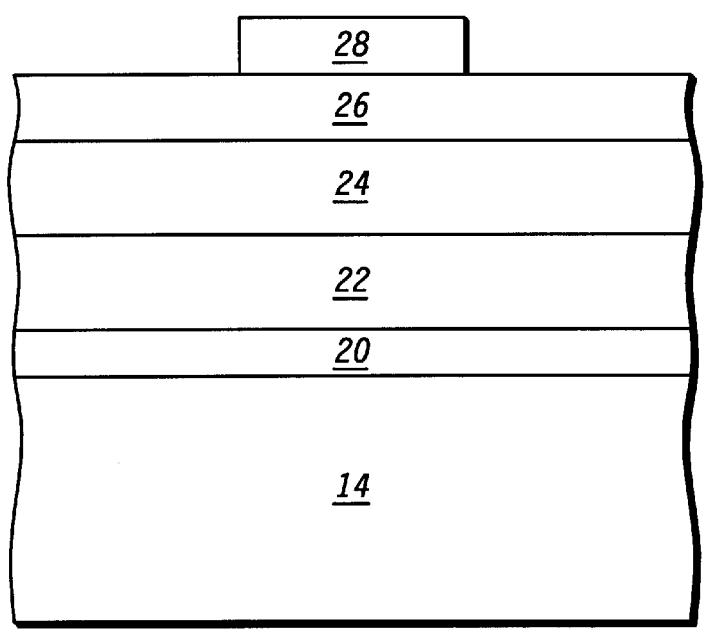
FIG. 2 is a cross-sectional view of the integrated circuit after a first fabrication step.

FIG. 2 shows a cross-sectional view of integrated circuit 10 at a first step of fabrication, including substrate 14 over which is formed a first blocking layer 20, a gate layer 22, a second blocking layer 24, a masking layer 26 and a photoresist pattern 28.

First blocking layer 20 comprises silicon dioxide formed by deposition or oxidation to overlie substrate 14 as shown. First blocking layer 20 typically is formed to a thickness of seventy-five angstroms.

Gate layer 22 is formed over first blocking layer 20. Gate layer 22 comprises a material that includes chromium. In one embodiment, gate layer 22 comprises a chromium based material such as chromium or chromium nitride ($Cr_xN_y$) formed to a thickness of two thousand angstroms.

Second blocking layer 24 is disposed over gate layer 22. Second blocking layer 24 typically comprises amorphous silicon formed to a thickness of one thousand angstroms.

Masking layer 26 is disposed over second blocking layer 24. Masking layer 26 typically comprises silicon dioxide formed to a thickness of one thousand angstroms.

Photoresist is deposited over masking layer 26 and exposed to produce photoresist pattern 28 for defining a conduction channel of transistor 12 in substrate 14.

Figure 3:
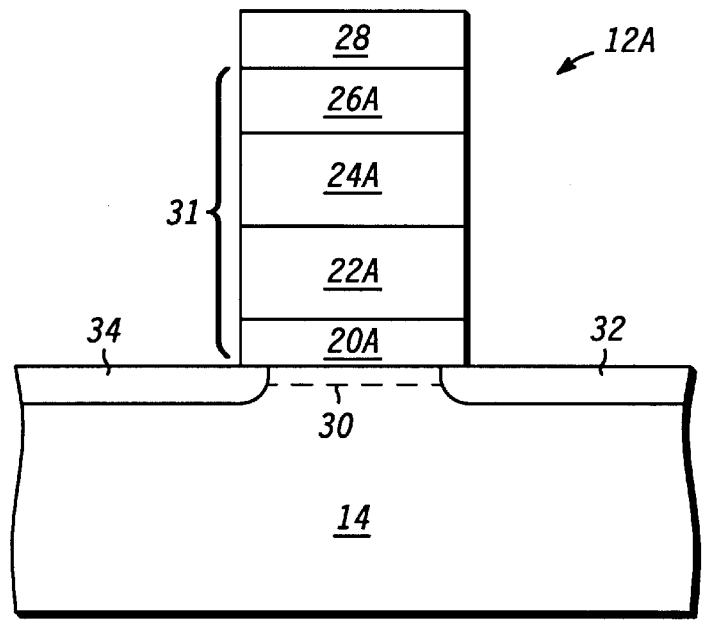
FIG. 3 is a cross-sectional view of a transistor of the integrated circuit after a second fabrication step.

FIG. 3 is a cross-sectional view of transistor 12 after a second step of fabrication. Masking layer 26 is patterned with photoresist pattern 28 and etched with a suitable silicon dioxide etchant such as hydrogen fluoride to produce a hard mask 26A. Photoresist pattern 28 is removed and a suitable silicon RIE etch is used to etch second blocking layer 24 to produce etch stop pattern 24A. Gate layer 22 is etched with a reactive ion etch containing oxygen to produce a dummy gate or sacrificial gate 22A. A suitable silicon dioxide etchant is used to etch first blocking layer 20 to produce etch stop pattern 20A.

The result of the successive etches is to produce a patterned stack 31 that includes hard mask 26A, etch stop pattern 24A, sacrificial gate 22A and etch stop pattern 20A as shown in FIG. 3. N-type dopants masked by stack 31 are introduced into substrate 14 to form a lightly doped source 32 and a lightly doped drain 34. In effect, lightly doped source 32 and lightly doped drain 34 are self-aligned to stack 31 to allow integrated circuit 10 to be fabricated with small physical dimensions. In one embodiment, the distance from lightly doped source 32 to lightly doped drain 34 is less than one hundred nanometers.

Figure 4:
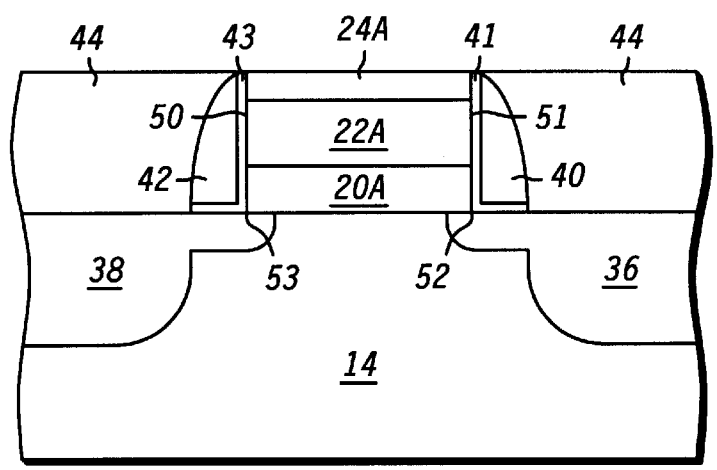
FIG. 4 is a cross-sectional view of the transistor after a third fabrication step.

Note that lightly doped source 32 and lightly doped drain 34 may be electrically activated by contact probing. Moreover, hard mask 26A and/or etch stop pattern 24A can be removed to enable electrical contact to sacrificial gate 22A. In some specific embodiments etch stop pattern 24A, which includes amorphous silicon, can be doped to be sufficiently conductive to perform the contact probing while retaining pattern 24A in position as shown in FIG. 4. Hence, a conduction channel 30 can be enabled in substrate 14 to produce a functioning transistor 12A which can operate as an in-line process monitor.

FIG. 4 is a cross-sectional view of transistor 12 after a third step of fabrication. Spacers 40 and 42 and liners 41 and 43 are formed adjacent to sacrificial gate 22A and etch stop pattern 24A, as shown, to mask N-type dopants being introduced into substrate 14 to form source 36 and drain 38. Spacers 40 and 42 typically comprise silicon nitride, and liners 41 and 43 typically comprise silicon dioxide.

A planarizing layer 44 is formed over substrate 14 to operate as an interlayer dielectric. A chemical mechanical polish or other planarizing step may be performed if further planarization is desired. If not previously done, hard mask 26A and etch stop pattern 24A are removed in succession.

Recall that sacrificial gate 22A comprises chromium nitride. As a feature of the present invention, sacrificial gate 22A is removed by etching with ceric ammonia nitrate, which selectively etches chromium nitride at a high etch rate while etching silicon dioxide and silicon nitride at a much lower rate. For example, in one embodiment, ceric ammonia nitrate etches chromium nitride five hundred times faster than it etches either silicon dioxide or silicon nitride.

The highly selective etch of ceric ammonia nitrate results in sacrificial gate 22A being completely removed, with little or no material removed from either etch stop pattern 20A or liners 41 and 43. Hence, sidewalls 50 and 51 remain substantially perpendicular to substrate 14, which facilitates control over critical transistor dimensions, e.g., the gate length. The selectivity of ceric ammonia nitrate has a further benefit of protecting substrate 14 from process induced defects because etch stop pattern 20A remains substantially intact.

As yet a further benefit, the invention virtually eliminates voids during the sacrificial gate removal due to the high selectivity of ceric ammonia nitrate to chromium nitride versus silicon oxide and silicon nitride. Such voids are common with previous methods, particularly in corners and edges exposed to the etchant, such as seams 52 and 53. Hence, the present invention provides integrated circuit 10 with improved reliability.

Etch stop pattern 20A is removed with hydrogen fluoride or other suitable etchant.

Figure 5:
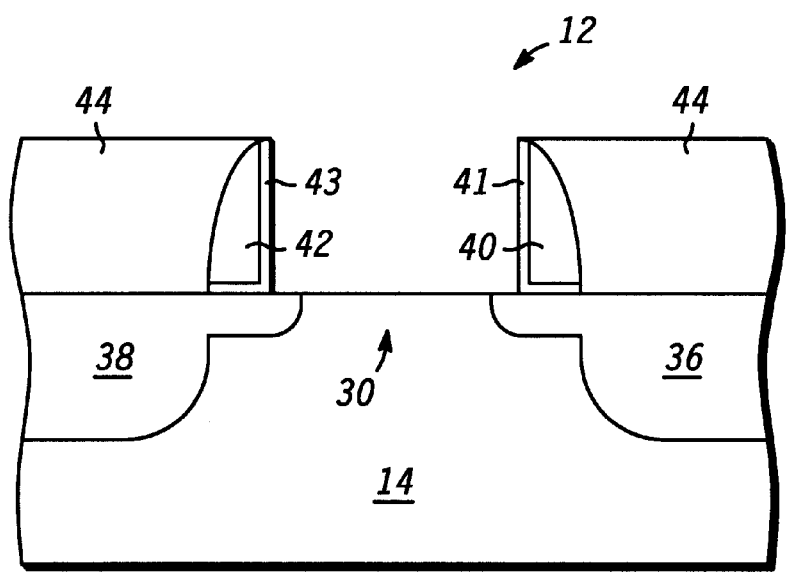
FIG. 5 is a cross-sectional view of the transistor after a fourth fabrication step.

The resulting structure is shown in FIG. 5, which is a cross-sectional view of transistor 12 after a fourth step of fabrication. Substrate 14 is subjected to a temperature exceeding eight hundred degrees Celsius to activate dopants in source 36 and drain 38. The region of conduction channel 30 may be doped if desired to provide a transistor threshold adjustment.

Figure 6:
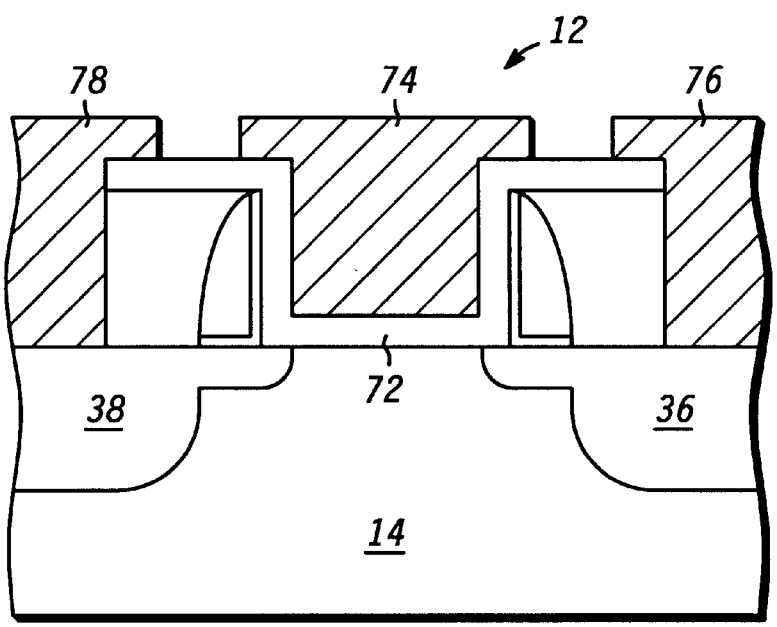
FIG. 6 is a cross-sectional view of the transistor after a fifth fabrication step.

FIG. 6 is a cross-sectional view of transistor 12 after a fifth step of fabrication. A gate dielectric 72 is disposed over substrate 14 as shown. Gate electrode 74 is formed over gate dielectric 72 to operate as a control electrode. Electrodes 76 and 78 provide electrical contact to source 36 and drain 38, respectively.

Gate dielectric 72 comprises a high permittivity material. In one embodiment, gate dielectric 72 is formed with strontium titanate having a relative permittivity greater than one hundred. It can be shown that similar control over transistor operation can be obtained with a thicker layer of high permittivity material than would be possible with a lower permittivity material. Hence, in one embodiment gate dielectric 72 is formed with a thickness of one hundred angstroms, substantially thicker than a gate dielectric of similar performance made with a low permittivity material.

Note that gate dielectric 72 is not subjected to high temperatures because the high temperature activation of source 36 and drain 38 is completed before gate dielectric 72 is formed.

Electrodes 74, 76, and 78 are formed by depositing and patterning a conductive material such as aluminum, polysilicon, copper or the like.

In brief, the present invention provides a device and method of making a transistor with improved dimension control and reliability. A dummy gate comprising a chromium based material is disposed over a semiconductor substrate for aligning source and drain regions of the transistor. The dummy gate subsequently is removed with an etch of ceric ammonia nitrate and replaced with a final gate electrode. Because of the highly preferential etch of ceric ammonia nitrate, little or no extraneous material is removed and voids in the transistor are virtually eliminated. Hence, high reliability is achieved. Moreover, the sides of the final gate electrode are substantially vertical, which improves the control over the transistor's critical dimensions, especially where the dimensions are less than one hundred nanometers.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a transistor, comprising the steps of:

forming a dielectric on a substrate; and forming a first material over the dielectric to define a gate region of the transistor, where the first material includes chromium;

introducing dopants into the substrate using the first material as a mask, and activating the dopants to form source and drain regions;

removing the first material and the dielectric from the gate region;

depositing a heat sensitive dielectric in the gate region; and depositing gate contact material on the heat sensitive dielectric in the gate region.

2. The method of claim 1, wherein the step of forming the dielectric on the substrate includes forming a thin layer of silicon oxide on the substrate.

3. The method of claim 2, wherein the step of forming the first material includes depositing a metal layer including one of chromium oxide and chromium nitride on the thin layer of silicon oxide.

4. The method of claim 3, wherein the step of forming the first material further includes depositing a layer of amorphous silicon on the metal layer.

5. The method of claim 3, wherein the step of forming the first material further includes depositing a layer of silicon oxide on the layer of amorphous silicon.

6. The method of claim 1, wherein the step of forming the first material to define the gate region for the transistor includes etching the first material to form sidewalls.

7. The method of claim 6, further including, subsequent to the step of etching the first material to form sidewalls and prior to the step of introducing dopants, forming sidewall spacers on the sidewalls of the first material.

8. The method of claim 6, wherein the step of forming the first material to define the gate region for the transistor includes depositing a plurality of layers including at least one etch stop layer and a layer including chromium, and the step of etching the first material to form sidewalls includes selectively etching the plurality of layers.

9. The method of claim 8, wherein the step of selectively etching the plurality of layers includes etching the layer including chromium with ceric ammonia nitrate.

10. The method of claim 8, wherein the step of removing the first material and the dielectric from the gate region includes selectively etching the plurality of layers.

11. The method of claim 1, wherein the step of depositing the gate contact includes the step of depositing one of a metal and polysilicon over the heat sensitive dielectric in the gate region.

12. The method of claim 1, wherein the step of depositing the gate contact includes the step of depositing one of aluminum and copper to form an electrode.

13. The method of claim 1, wherein the step of activating includes the step of heating the semiconductor substrate to a temperature greater than eight hundred degrees Celsius.

14. The method of claim 1, wherein the step of activating includes the step of laser annealing the semiconductor substrate.

15. A method of fabricating an integrated circuit, comprising the steps of:

forming a dielectric layer on a semiconductor substrate;

disposing a chromium based material on a predefined area of the dielectric layer to form an electrode of the integrated circuit;

forming the chromium based material to define a gate region of a transistor;

doping source and drain regions of the semiconductor substrate on opposite sides of the gate region and activating the source and drain regions;

removing the chromium based material and the dielectric layer in the gate region;

depositing a temperature sensitive dielectric material in the gate region; and depositing a conductive material over the temperature sensitive dielectric material in the gate region to form a gate electrode of the transistor.

16. The method of claim 15, wherein the step of disposing the chromium based material includes the step of disposing one of chromium nitride and chromium oxide on the predefined area.

17. The method of claim 15, further comprising the step of activating the source and drain regions includes elevating the temperature of the semiconductor substrate to a temperature higher than a temperature which would damage the sensitive dielectric material.

18. A method of fabricating a transistor, comprising the steps of:

forming a dielectric layer on a semiconductor substrate;

depositing a plurality of layers, including at least one layer containing chromium, sequentially on the dielectric layer;

forming the plurality of layers to define a gate region of a transistor;

doping source and drain regions of the semiconductor substrate on opposite sides of the gate region and activating the source and drain regions;

removing the plurality of layers and the dielectric layer in the gate region;

depositing a temperature sensitive dielectric material in the gate region; and depositing a conductive material over the temperature sensitive dielectric material in the gate region to form a gate electrode of the transistor.

19. The method of claim 18, wherein the step of forming the plurality of layers to define the gate region for the transistor includes etching the plurality of layers to form sidewalls.

20. The method of claim 19, further including, subsequent to the step of etching the plurality of layers to form sidewalls and prior to the step of introducing dopants, forming sidewall spacers on the sidewalls of the plurality of layers.

21. The method of claim 19, wherein the step of etching the plurality of layers to form sidewalls includes selectively etching the plurality of layers.

22. The method of claim 21, wherein the step of selectively etching the plurality of layers includes etching the layer including chromium with ceric ammonia nitrate.

23. The method of claim 18, wherein the step of removing the plurality of layers and the dielectric from the gate region includes selectively etching the plurality of layers.

* * * * *